(12) United States Patent
Tanaka

(10) Patent No.: US 8,467,034 B2
(45) Date of Patent: Jun. 18, 2013

(54) LIGHT SHIELDING UNIT, VARIABLE SLIT APPARATUS, AND EXPOSURE APPARATUS

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 704 days.

(21) Appl. No.: 12/488,361

(22) Filed: Jun. 19, 2009

(65) Prior Publication Data

US 2010/0002220 A1 Jan. 7, 2010

Related U.S. Application Data

(60) Provisional application No. 61/129,535, filed on Jul. 2, 2008.

(51) Int. Cl.
*G03B 27/72* (2006.01)

(52) U.S. Cl.
USPC .......... 355/71; 355/50; 355/53; 355/77

(58) Field of Classification Search
USPC .......... 355/50, 53, 71, 77
See application file for complete search history.

(56) References Cited

U.S. PATENT DOCUMENTS

| | | | | |
|---|---|---|---|---|
| 5,392,094 | A * | 2/1995 | Kudo | 355/67 |
| 5,895,737 | A * | 4/1999 | McCullough et al. | 430/30 |
| 6,452,661 | B1 | 9/2002 | Komatsuda | |
| 7,864,297 | B2 * | 1/2011 | Kawahara | 355/71 |
| 2003/0117600 | A1 * | 6/2003 | Taniuchi et al. | 355/53 |
| 2004/0114121 | A1 * | 6/2004 | Nishi et al. | 355/67 |
| 2005/0035684 | A1 * | 2/2005 | Fuse et al. | 310/311 |
| 2005/0117136 | A1 | 6/2005 | Tominaga | |
| 2005/0122502 | A1 | 6/2005 | Nemoto | |
| 2006/0114439 | A1 * | 6/2006 | Muijderman et al. | 355/69 |
| 2007/0014112 | A1 * | 1/2007 | Ohya et al. | 362/268 |
| 2011/0096317 | A1 * | 4/2011 | Stuetzle et al. | 355/71 |

FOREIGN PATENT DOCUMENTS

| | | |
|---|---|---|
| EP | 1 503 246 A2 | 2/2005 |
| EP | 1 503 246 A3 | 2/2005 |
| JP | 2007-207821 | 8/2007 |
| WO | WO 2005/048326 A1 | 5/2005 |

OTHER PUBLICATIONS

Partial International Search Report from the European Patent Office, International Application No. PCT/JP2009/062079 dated Oct. 12, 2009.
International Search Report mailed Dec. 3, 2009, for International Patent Application No. PCT/JP2009/062079.
International Preliminary Report on Patentability and Written Opinion issued Jan. 5, 2011, for International Patent Application No. PCT/JP2009/062079.

\* cited by examiner

*Primary Examiner* — Thomas R Artman
(74) *Attorney, Agent, or Firm* — Finnegan, Henderson, Farabow, Garrett & Dunner, L.L.P.

(57) ABSTRACT

A light shielding unit, which shields a part of an exposure light with a light shielding member, includes a sensor which detects displacement of the light shielding member, a driving device which drives the light shielding member based on a detection result obtained by the sensor, a case which accommodates the sensor and the driving device, and a bellows mechanism which gas-seals the case with respect to the light shielding member. When the illumination area of the illumination light is defined, it is possible to mitigate the influence of the foreign matters and/or the heat generated from the driving mechanism.

23 Claims, 8 Drawing Sheets

LIGHT SHIELDING UNIT, VARIABLE SLIT APPARATUS, AND EXPOSURE APPARATUS

CROSS-REFERENCES TO RELATED APPLICATIONS

This application claims the benefit of priority of U.S. Provisional Application No. 61/129,535 filed on Jul. 2, 2008, the entire disclosures of which are incorporated herein by reference.

BACKGROUND OF THE INVENTION

1. Field of the Invention

The present invention relates to a light shielding unit which controls illumination light (illumination light beam), a variable slit apparatus which forms the shape of the illumination light into a slit shape, etc., an exposure technique using the variable slit apparatus, and a technique for producing a device using the exposure technique.

2. Description of the Related Art

For example, upon producing a semiconductor device or the like, in order that a pattern, which is formed on a reticle (or a photomask or the like), is transferred onto a wafer (or a glass plate or the like) coated with a resist to perform the exposure, an exposure apparatus has been hitherto used, which employs, as the exposure light (exposure light beam), a light (light beam) in the range from the far ultraviolet region to the vacuum ultraviolet region including the emission line of a mercury lamp, the excimer laser beam, etc. Recently, in order to enhance the resolution by shortening the exposure wavelength, an exposure apparatus (hereinafter referred to as "EUV exposure apparatus") has been also developed, which employs, as the exposure light, the extreme ultraviolet light (hereinafter referred to as "EUV light") which has a wavelength of, for example, not more than about 100 nm.

In relation to the exposure apparatuses as described above, in a scanning type exposure apparatus (for example, a scanning stepper) in which the wafer is exposed while synchronously moving the reticle and the wafer with respect to the projection optical system, the illumination area, with which the reticle is illuminated, is defined to have a slit shape such as a rectangular shape or a circular arc shape, etc. which is long in a direction perpendicular to the scanning direction. Conventionally, in order to define the slit-shaped illumination area, for example, a variable blind is used, which is provided with a first blind having a plurality of movable blades for defining the shape of a long side of the illumination area and a second blind having, for example, a substantially linear or circular arc-shaped edge portion for defining the shape of the other portion of the illumination area other than the long side (see, for example, International Publication No. 2005/48326).

SUMMARY OF THE INVENTION

In the conventional variable blind, when the blade is driven in order to control the shape of the illumination area, fine or minute foreign matters such as the dust or the like are sometimes generated from the driving mechanism of the blade. In this situation, if the foreign matters adhere to a certain optical member or members included in the illumination optical system and the projection optical system, then the transmittance or the reflectance of the certain optical member(s) is gradually lowered, and the efficiency of use of the exposure light is lowered.

In the case of the exposure apparatus which uses, as the exposure light, a light in the range ranging from the far ultraviolet region to the vacuum ultraviolet region including, for example, the emission line of the mercury lamp and the excimer laser beam, if the particle of the like adheres to a surface of the pattern (pattern surface) of the reticle, then the particle is also transferred onto the wafer. In view of the above, a transparent thin film, which is called "pellicle", is attached, via a frame, to the pattern surface of the reticle at a position slightly separated and away from the pattern surface.

However, at present, in the EUV exposure apparatus, any optimum pellicle, through which the EUV light is transmissive, is not present. Therefore, it is impossible to attach the pellicle to the reticle.

In such a situation, if the foreign matter, which is generated from the driving mechanism of the blade, adheres to the pattern surface of the reticle, the wafer is exposed with a pattern different from or other than the originally intended pattern. Therefore, the adhesion is a factor to lower the resolution especially in the apparatus having the high resolution such as the EUV exposure apparatus.

It is feared that the characteristic such as the resolution, etc. might be deteriorated also in a case that the state of the edge portion of the illumination area (for example, the defocus amount of the image of the edge portion of the blade), which is defined by the movable blind, is changed, for example, due to the fluctuation of the height of the reticle.

Further, it is also feared that the shape of the reticle and the shape of the optical member included in the projection optical system, etc. might be slightly deformed or changed due to the influence of the heat generated from the driving mechanism of the blade. In such a situation, in an apparatus in which any gas is present in the optical path for the exposure light, the heat generated from the driving mechanism is diffused by the convection current of the gas, and the influence by the heat is mitigated. However, in an apparatus which uses the exposure light (for example, the EUV light) having the short wavelength of not more than those approximately in the vacuum ultraviolet region, the optical path for the exposure light is in vacuum. Therefore, it is feared that the heat generated from the driving mechanism might directly arrive at the optical member due to the radiation or emission, and thus the influence such as the thermal deformation might be exerted on the optical member.

Taking the foregoing situations into consideration, a first object of the present invention is to provide an illumination technique which makes it possible to mitigate the influence of the foreign matter and/or the heat generated from the driving mechanism when the illumination area of the illumination light is defined.

A second object of the present invention is to provide an illumination technique which makes it possible to adjust the state (for example, the defocus amount) of the edge portion of the illumination area of the illumination light.

According to a first aspect of the present invention, there is provided a light shielding unit comprising a light shielding member which shields a part of an illumination light; a driving mechanism which drives the light shielding member to control a light amount (light shielding amount) of the illumination light; a detector which detects a driving amount of the light shielding member; a case which accommodates the driving mechanism and the detector; and a bellows mechanism which gas-seals the case with respect to the light shielding member.

According to a second aspect of the present invention, there is provided a variable slit apparatus which forms an illumination light having a predetermined shape, the variable slit apparatus comprising a plurality of the light shielding units of the present invention; wherein the light shielding members of the light shielding units are arranged in a same plane.

According to a third aspect of the present invention, there is provided a variable slit apparatus which forms an illumination light having a predetermined shape, the variable slit apparatus comprising: a plurality of light shielding units which include light shielding members shielding a part of the illumination light, respectively; and a tilt mechanism which controls angles of inclination of the plurality of light shielding units or the light shielding members of the light shielding units to control positions of the light shielding members in an optical axis direction of the illumination light.

According to a fourth aspect of the present invention, there is provided an exposure apparatus which illuminates a pattern with an exposure light and exposes a substrate with the exposure light via the pattern and a projection optical system, the exposure apparatus comprising the variable slit apparatus of the present invention; wherein a part of the exposure light is shielded by the light shielding members of the variable slit apparatus.

According to a fifth aspect of the present invention, there is provided an exposure apparatus which exposes a substrate with an illumination light via a pattern, the exposure apparatus comprising a variable slit having a plurality of light shielding members which are arranged on a same plane and which shield a part of the illumination light, and a driving device which drives the light shielding members; and an optical system which guides the illumination light, passing through the variable slit, to the substrate; wherein the driving device exists in a space which is independent from a space in which the light shielding members exist and a space in which the optical system exists.

According to a sixth aspect of the present invention, there is provided a method for producing a device, comprising exposing a photosensitive substrate by using the exposure apparatus of the present invention; and processing the exposed photosensitive substrate.

According to the present invention, the driving mechanism for the light shielding member is accommodated in the case (container or vessel), and the gas-tight sealing is provided between the light shielding member and the case. Therefore, the influence of the foreign matters and/or the heat generated from the driving mechanism is mitigated.

According to the present invention, it is possible to adjust the state (for example, the defocus amount) of the edge portion of the illumination area of the illumination light, and thus it is possible to perform the highly accurate exposure.

DESCRIPTION OF THE PREFERRED EMBODIMENTS

An example of the embodiment of the present invention will be explained with reference to FIGS. 1 to 4 by way of example.

Figure 1:
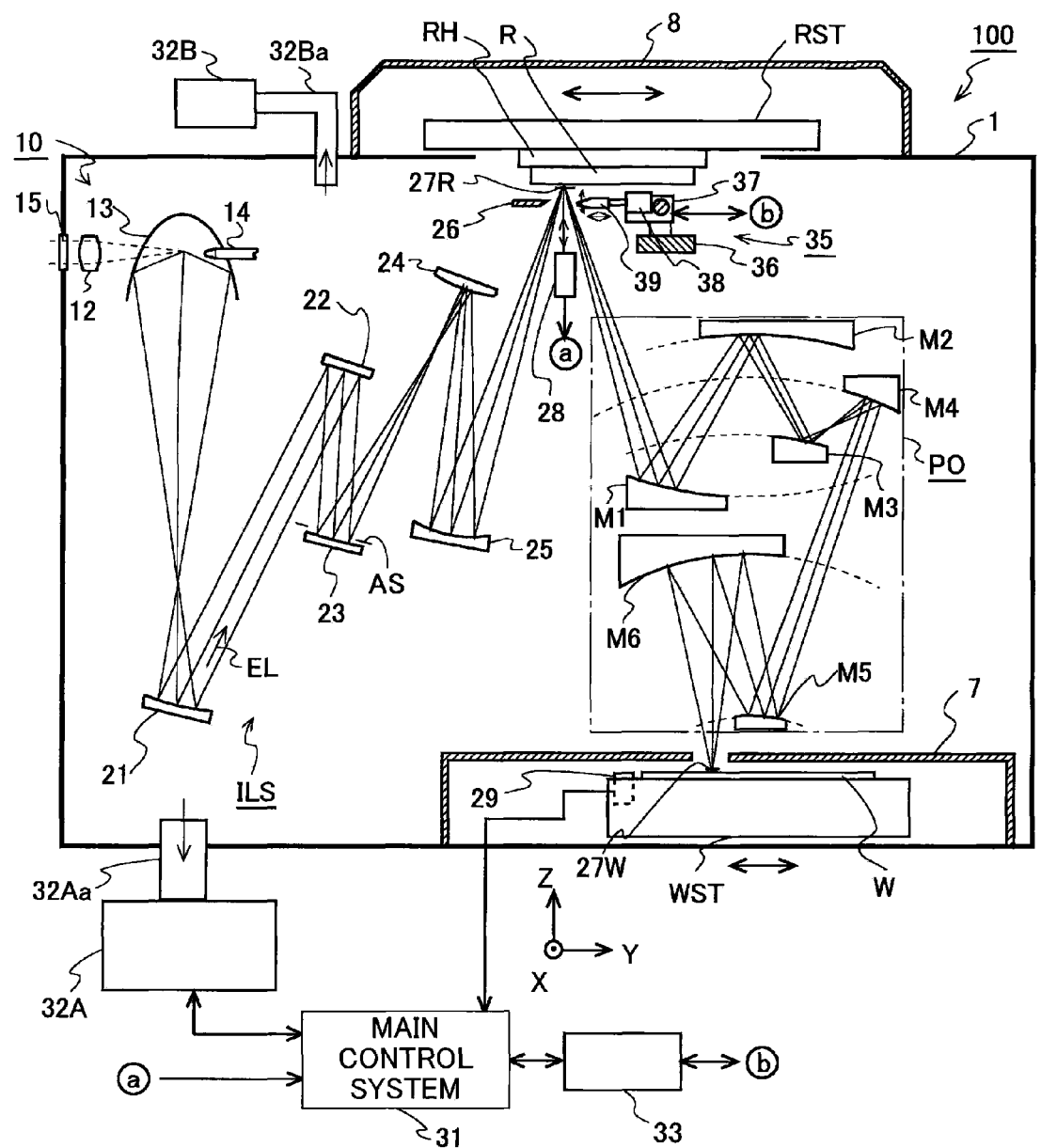
FIG. 1 is a sectional view of a schematic construction of an example of exposure apparatus of an embodiment of the present invention.

FIG. 1 is a sectional view schematically illustrating the overall construction of an exposure apparatus (EUV exposure apparatus) 100 of this embodiment which uses, as an exposure light EL (illumination light), the EUV light having a wavelength of within a range of about 3 to 50 nm, for example, a wavelength of 11 nm or 13 nm, etc. With reference to FIG. 1, the exposure apparatus 100 includes a laser plasma light source 10 which generates the exposure light (illumination light) EL; an illumination optical system ILS which illuminates a reticle R (mask) with the exposure light EL; a reticle stage RST which is movable while holding the reticle R; and a projection optical system PO which projects a pattern formed on a pattern surface (reticle surface) of the reticle R onto a wafer W (photosensitive substrate) coated with a resist (photosensitive material). The exposure apparatus 100 further includes a wafer stage WST which is movable while holding the wafer W; a main control system 31 which includes a computer integrally controlling the operation of the entire apparatus; etc.

In this embodiment, the EUV light is used as the exposure light EL. Therefore, each of the illumination optical system ILS and the projection optical system PO is constructed of a plurality of catoptric optical members, except for specific filters or the like (not shown), and the reticle R is also of the catoptric or reflecting type. Multilayered reflective films, which reflect the EUV light, are formed on the reticle surface and the reflecting surfaces of the catoptric optical members. A circuit pattern is formed by an absorbing layer on the reflective film on the reticle surface. In order to avoid the absorption of the exposure light EL by a gas, the exposure apparatus 100 is accommodated in a box-shaped vacuum chamber 1 (in a space defined or comparted by the vacuum chamber 1) approximately as a whole. For example, large-sized vacuum pumps 32A, 32B are provided in order to perform the vacuum evacuation for the space in the vacuum chamber 1, for example, via gas discharge tubes 32Aa, 32Ba. A plurality of subchambers (not shown) are also provided in order to further enhance the degree of vacuum on the optical path for the exposure light EL in the vacuum chamber 1. For example, the vacuum chamber 1 has an internal gas pressure of about $10^{-5}$ Pa, and a subchamber (not shown), which accommodates the projection optical system PO in the vacuum chamber 1, has an internal gas pressure of about $10^{-5}$ to $10^{-6}$ Pa.

The following description will be made assuming that, in FIG. 1, the Z axis extends in the normal line direction of a surface (bottom surface of the vacuum chamber 1) on which the wafer stage WST is placed; the X axis extends perpendicularly to the sheet surface of FIG. 1 in a plane perpendicular to the Z axis; and the Y axis extends in parallel to the sheet surface of FIG. 1. In this embodiment, the illumination optical system ILS forms, on the reticle surface, a long or elongated circular arc-shaped illumination area extending in the X direction. During the exposure, the reticle R and the wafer W are synchronously scanned in the Y direction (scanning direction) with respect to the projection optical system PO.

At first, the laser plasma light source 10 is a light source of the gas jet cluster system including a high output laser light source (not shown); a light-collecting lens 12 which collects the laser light (laser beam) supplied from the laser light source via a window member 15 of the vacuum chamber 1; a nozzle 14 which jets a target gas of xenon or krypton, etc.; and a light-collecting mirror 13 which has a spheroidal plane-shaped reflecting surface. The exposure light EL, which is radiated from the laser plasma light source 10, is focused or collected on the second focal point of the light-collecting mirror 13. The exposure light EL focused or collected on the second focal point is substantially converted into a parallel light flux via a concave mirror 21, and is guided to an optical integrator constructed of a pair of fly's eye optical systems 22, 23 which uniformize the illuminance distribution of the exposure light EL. More specified structure and function of the fly's eye optical systems 22, 23 are disclosed, for example, in U.S. Pat. No. 6,452,661; and the disclosure of U.S. Pat. No. 6,452,661 is incorporated herein by reference.

With reference to FIG. 1, a plane, which is located in the vicinity of the reflecting surface of the fly's eye optical system 23, is the pupil plane of the illumination optical system ILS. An aperture diaphragm AS is arranged at the pupil plane or at a position in the vicinity of the pupil plane. The aperture diaphragm AS representatively expresses a plurality of aperture diaphragms having apertures of various shapes. By exchanging the aperture diaphragm AS under the control of the main control system 31, it is possible to switch the illumination condition, for example, into the ordinary illumination, the annular illumination, the dipole illumination, or the quadruple illumination, etc.

The exposure light EL, which has passed through the aperture diaphragm AS, is once collected or focused, and then the exposure light EL comes into a curved mirror 24. The exposure light EL, which is reflected by the curved mirror 24, is reflected by a concave mirror 25. After that, the exposure light EL passes along a substantially circular arc-shaped edge portion of a blind plate 26 which is long in the X direction, and the end portion in the −Y direction of the exposure light EL is formed to have a circular arc shape. The exposure light EL formed to have the circular arc shape illuminates the pattern surface of the reticle R obliquely from below at a uniform illuminance distribution. Therefore, a circular arc-shaped illumination area 27R is formed on the pattern surface of the reticle R. A condenser optical system is constructed of the curved mirror 24 and the concave mirror 25. Owing to the condenser optical system, the lights (light beams) from a large number of reflecting mirror elements of the second fly's eye optical system 23 illuminate the illumination area 27R of the reticle surface in a superimposed manner. In the exemplary embodiment shown in FIG. 1, the curved mirror 24 is a convex mirror. However, the curved mirror 24 may be formed of a concave mirror, and the curvature of the concave mirror 25 may be decreased in an amount corresponding thereto. The illumination optical system ILS is constructed to include the concave mirror 21, the fly's eye optical systems 22, 23, the aperture diaphragm AS, the curved mirror 24, and the concave mirror 25. The illumination optical system ILS may be constructed in any manner. For example, in order to further decrease the angle of incidence of the exposure light EL with respect to the reticle surface, a mirror may be arranged, for example, between the concave mirror 25 and the reticle R.

A part of the exposure light EL reflected by the reticle surface is shielded by end portions of blades 39 of a plurality of blind units 38 arranged in the X direction, and the exposure light EL comes into the projection optical system PO. The exposure light EL, which has passed through the projection optical system PO, is projected onto an exposure area 27W on the wafer W (area conjugate with the illumination area 27R). In this case, a variable blind (variable field diaphragm) 35, which defines the shape of the illumination area 27R as well as the shape of the exposure area 27W, is constructed to include the blind plate 26 and the large number of blind units 38 (details will be described later on). The reticle surface is conjugate with an arrangement plane in which the fly's eye optical system 22 is arranged. The general shape of the illumination area 27 is defined also by the shapes of the individual mirror elements constructing the fly's eye optical system 22.

An opening/closing blind, which is usable for closing the exposure area 27W in the Y direction (scanning direction) upon the start and the completion of the scanning exposure for each of the shot areas (dies) on the wafer W and for defining the width of the exposure area 27W (illumination area 27R) in the X direction, may be arranged, for example, in the vicinity of the blind plate 26 or on a conjugate plane conjugate with the reticle surface.

The reticle R is attracted and held on the bottom surface of the reticle stage RST via an electrostatic chuck RH. The reticle stage RST is driven by a predetermined stroke in the Y direction by a driving system (not shown) on a guide surface parallel to the XY plane, of the outer surface of the vacuum chamber 1, based on a measured value obtained by a laser interferometer (not shown) and control information of the main control system 31. Further, the reticle stage RST is also driven in a minute amount, for example, in the X direction and the θZ direction (direction of rotation about the Z axis). A partition 8 is provided to cover the reticle stage RST on the side of the vacuum chamber 1. The interior of the partition 8 is maintained at a gas pressure between the atmospheric pressure and the gas pressure in the vacuum chamber 1 by an unillustrated vacuum pump.

An autofocus sensor (hereinafter referred to as "reticle AF system") 28, which includes a light-emitting system which radiates a measuring light (measuring light beam) obliquely (for example, in the −X direction) onto the illumination area 27R at a plurality of positions in the illumination area 27R; and a light-receiving system which receives the measuring light reflected obliquely (for example, in the +X direction) by the reticle R, is arranged on the side of the reticle surface. The reticle AF system 28 measures the positions in the Z direction at a plurality of places in the illumination area 27R in the reticle surface, and supplies the measured values to the main control system 31. The main control system 31 sets or determines the position in the Z direction (Z position) of the reticle surface to be within an allowable range by using, for example, a Z driving mechanism (not shown) included in the reticle stage RST, based on the measured values obtained by the reticle AF system 28 during the scanning exposure. Further, the main control system 31 controls the angle of rotation of the blind unit 38 via a blind control system 33 (details will be described later on), so that, for example, the spacing distance in the Z direction, which is between the reticle surface and the end portion of the blade 39 of the variable blind 35, is maintained to be within a predetermined range.

The projection optical system PO is constructed, for example, by holding six mirrors M1 to M6 with an unillustrated barrel. The projection optical system PO is a catoptric system which is non-telecentric on the side of the object (reticle R) and which is telecentric on the side of the image (wafer W). The projection magnification of the projection optical system PO is a reduction magnification of, for example, ¼-fold. The exposure light EL reflected by the illumination area 27R of the reticle R forms a reduction image of a part of the pattern of the reticle R in the exposure area 27W on the wafer W via the projection optical system PO.

In the projection optical system PO, the exposure light EL reflected by the reticle surface is reflected by the mirror M1 in the upward direction (+Z direction), and then is reflected by the mirror M2 in the downward direction. After that, the exposure light EL is reflected by the mirror M3 in the upward direction, and the exposure light EL is reflected by the mirror M4 in the downward direction. Subsequently, the exposure light EL, which is reflected by the mirror M5 in the upward direction, is reflected by the mirror M6 in the downward direction to form, on the wafer W, the image of the part of the pattern of the reticle R. For example, the mirrors M1, M2, M4, M6 are concave mirrors, and the other mirrors M3, M5 are convex mirrors. The projection optical system PO is not limited to the construction shown in FIG. 1; and the number of the catoptric optical members may be any number other than six.

On the other hand, the wafer W is attracted and held on the wafer stage WST via an electrostatic chuck (not shown). The wafer stage WST is arranged on a guide surface arranged on the XY plane. The wafer stage WST is driven by predetermined strokes in the X direction and the Y direction by a driving mechanism (not shown) based on a measured value obtained by a laser interferometer (not shown) and the control information of the main control system 31. The wafer stage WST is also driven, for example, in the θZ direction, if necessary.

A radiation amount monitor 29, which includes a plurality of photoelectric sensors arranged, for example, in the X direction, in the vicinity of the wafer W on the wafer stage WST. A detection signal of the radiation amount monitor 29 is supplied to the main control system 31. By driving the wafer stage WST to move a light-receiving surface of the radiation amount monitor 29 to the exposure area 27W, it is possible to measure the illuminance (or the pulse energy) of the exposure light EL, on the exposure area 27W (illumination area 27R), at each of measuring positions in the X direction of the exposure area 27W (illumination area 27R). The main control system 31 controls, based on the measurement result, the width (slit width) in the Y direction at each of the positions in the X direction of the illumination area 27R with the variable blind 35 via the blind control system 33 so that the totalized amount of exposure is uniform at the respective points on the wafer W subjected to the scanning with respect to the exposure area 27W. The main control system 31 adjusts the positions of the respective blades with respect to the reticle surface via the blind control system 33 based on the measurement result so that the positions of the respective blades 39 with respect to the reticle surface (spacing distances between the reticle surface and the respective blades) are in a predetermined relationship. The control of the variable blind 35 will be described later on.

During the exposure, the wafer W is arranged at the inside of a partition 7 so that the gas, which is generated from the resist on the wafer W, does not exert any harmful influence on the mirrors M1 to M6 of the projection optical system PO. An opening, through which the exposure light EL is allowed to pass, is formed in the partition 7. The space in the partition 7 is vacuum evacuated by a vacuum pump (not shown).

When one shot area (die) on the wafer W is exposed, the exposure light EL, which is formed to be circular arc-shaped, is irradiated onto the reticle surface by the illumination optical system ILS. The exposure light EL reflected by the illumination area 27R of the reticle surface comes into the projection optical system PO. During this process, the reticle R and the wafer W are synchronously moved (subjected to the synchronous scanning), with respect to the projection optical system PO, in the Y direction at a predetermined velocity ratio in accordance with the reduction magnification of the projection optical system PO. In this way, the pattern of the reticle R is exposed onto one shot area on the wafer W. After that, the wafer W is step-moved by driving the wafer stage WST, and then the next shot area on the wafer W is subjected to the scanning exposure with the pattern of the reticle R. In this way, the plurality of shot areas on the wafer W are successively exposed with the image of the pattern of the reticle R in the step-and-scan manner.

Next, the variable blind 35 of the exposure apparatus 100 of this embodiment will be explained.

Figure 2A:
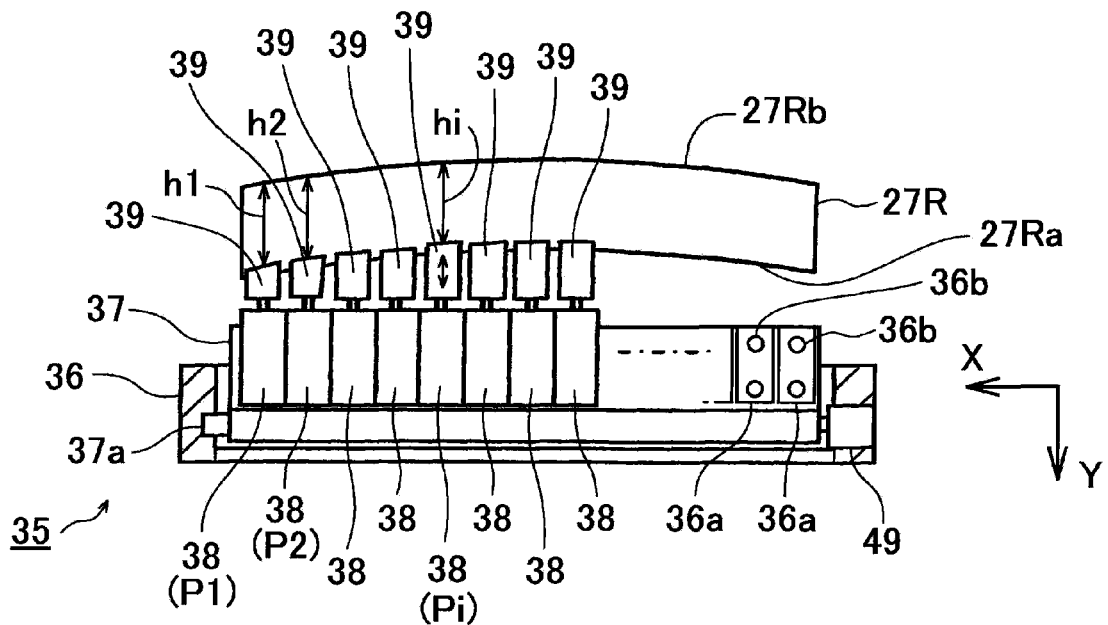
FIG. 2A shows, with partial cutaway, a plan view of a variable blind 35 shown in FIG. 1.

FIG. 2A shows, with partial cutaway, a plan view of the variable blind 35 shown in FIG. 1, as seen from the side of the reticle R. With reference to FIG. 2A, the shape of an edge portion 27Rb in the −Y direction of the circular arc-shaped illumination area 27R on the reticle R is defined by the blind plate 26 shown in FIG. 1. A plurality of blind units 38 are fixed while making tight contact with each other in the X direction at positions Pi (i=1, 2, . . . ) on a rotatable member 37 having an L-shaped cross-sectional shape. The blind units 38 are provided with the blades 39 which are displaceable in the Y direction, respectively. The blades 39 shield the edge portion 27Ra in the +Y direction of the exposure light reflected from the illumination area 27R. As the number of the blind units 38 (blades 39) is greater, the shape of the illumination area 27R can be controlled more accurately or precisely. The number of the blind units 38 is, for example, about ten to several tens.

In this case, the edge portion 27Ra is circular arc-shaped. Therefore, the blades 39 of the plurality of blind units 38 are designed such that the length in the Y direction is the shortest at blades 39, among the plurality of blades 39, which are positioned at the both ends (for example, a blade 39 at position P1), and the length in the Y direction is longer at blades 39 positioned at the central portion among the plurality of blades 39. By controlling the position in the Y direction of the blade 39 of the blind unit 38 disposed at the position Pi, it is possible to individually control the width (slit width) hi in the Y direction of the illumination area 27R at the position Pi. For example, in the initial state, the setting is made such that the shielding widths in the Y direction of the exposure light, which are brought about by the blades 39 of all of the blind units 38, are approximately identical, and that the slit widths hi of the illumination area 27R are approximately identical as well.

In FIG. 2A, the plurality of blind units 38, which are disposed, on the rotatable member 37, on the side in the −X direction, are omitted from the illustration. A plurality of positioning grooves 36a are formed on the rotatable member 37 to position the bottom surfaces of the blind units 38 respectively. The respective blind units 38 are placed on the corresponding positioning grooves 36a, respectively, and then the blind units 38 are fixed by bolts 50 through openings 36b, respectively (see FIG. 3A). Therefore, the respective blind units 38, which are fixed on the rotatable member 37, can be easily exchanged with other blind units, for example, when the maintenance is performed, etc.

The rotatable member 37 is supported by a frame 36 rotatably about a rotary shaft 37a which is parallel to the X axis. One end of the rotary shaft 37a can be rotated by a rotary motor 49 which is fixed to the frame 36. The frame 36 is supported, for example, by the side wall of the vacuum chamber 1 shown in FIG. 1 via a connecting member (not shown). The rotary motor 49 is controlled by the blind control system 33.

Figure 2B:
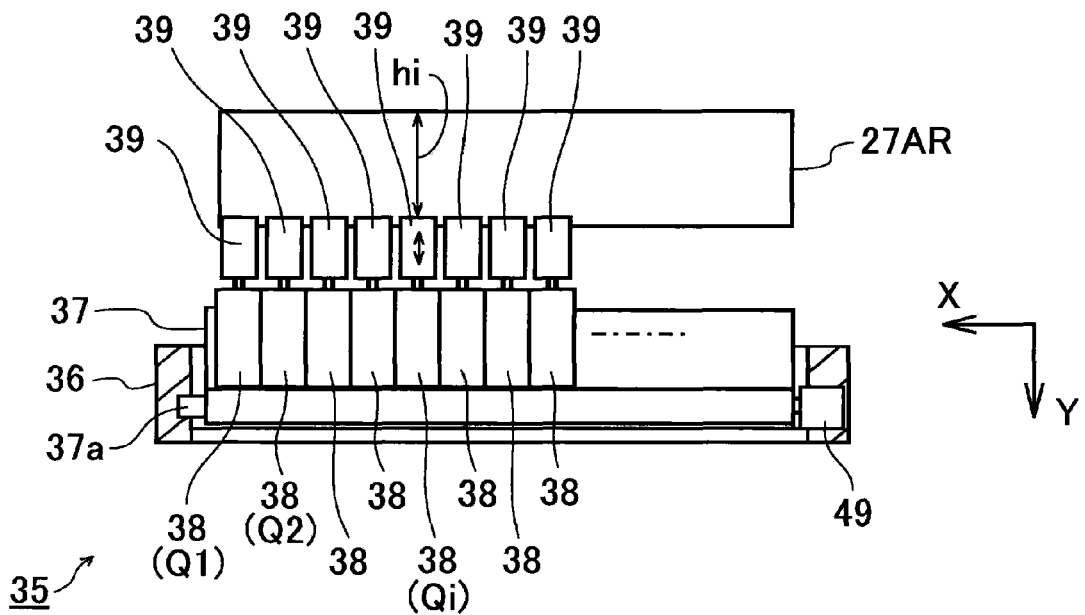
FIG. 2B shows a plan view of a variable blind 35 when the illumination area is oblong or rectangular.

As shown in FIG. 2B, for example, a rectangular (oblong) illumination area 27AR, which extends in the X direction on the reticle surface, may be formed by the illumination optical system ILS. In this case, all of the lengths of the blades 39 in the Y direction of the blind units 38, provided at the respective positions Qi (i=1, 2, . . . ) on the rotatable member 37, may be identical with each other. That is, the shapes of the end portions of the blades 39 of the plurality of blind units 38 may be changed depending on the shape of the illumination area. Also in this case, by controlling the position in the Y direction of the blade 39 located at the position Qi, the slit width hi in the Y direction of the illumination area 27AR is individually controlled.

Figure 3A:
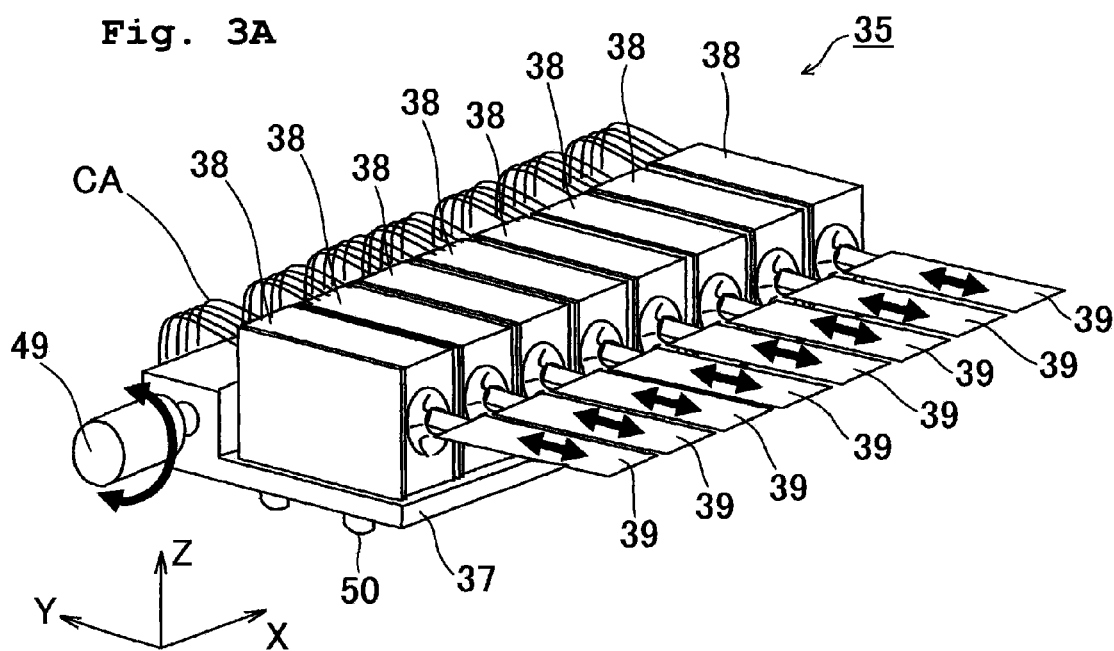
FIG. 3A is a perspective view of main components of a rotating mechanism for a plurality of blind units 38 shown in FIG. 1.
Figure 3B:
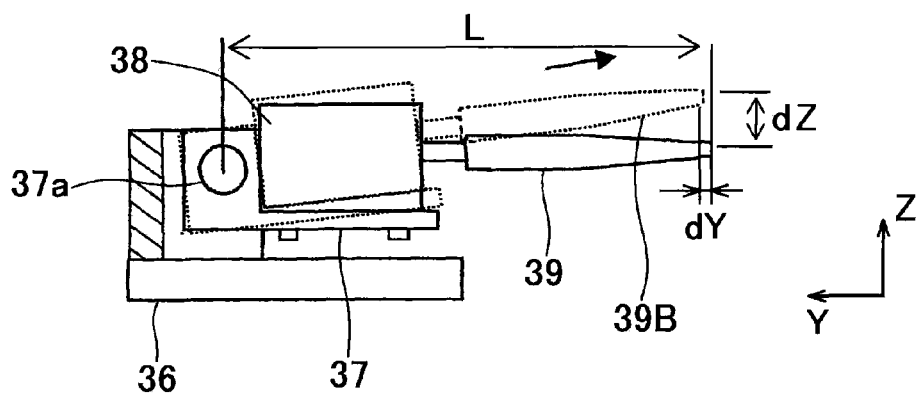
FIG. 3B is a side view of the rotating mechanism shown in FIG. 3A.

FIG. 3A is a perspective view of main components of a support mechanism for the plurality of blind units 38 of the variable blind 35 shown in FIG. 2A, and FIG. 3B is a side view in which those shown in FIG. 3A are viewed in the +X direction. For the purpose of convenience of the explanation, the blades 39 of the blind units 38 are illustrated as having a same shape in FIG. 3A. However, actually, as appreciated from FIG. 2A, the shapes of the blades 39 are different from each other. Further, the frame 36 shown in FIG. 3B is omitted from the illustration in FIG. 3A.

With reference to FIG. 3A, the positions in the Y direction of the blades 39 of the respective blind units 38 can be controlled independently from each other. Each of the blind units 38 is connected, via a signal cable CA, to the blind control system 33 shown in FIG. 1. By rotating the rotatable member 37 via the rotary motor 49, the respective blind units 38 can be integrally rotated about the center of the axis of rotation of the rotary motor 49 as shown in FIG. 3B. Accordingly, the blind units 38 are each inclined from the original posture, and the Z positions of the end portions of the blades 39 of the respective blind units 38 can be adjusted by dZ as indicated by a position 39B depicted by dotted lines. The operation as described above is performed in order to maintain the spacing distance to be constant between the reticle surface and the end portions of the blades 39, for example, when the Z position of the reticle surface, which is measured by the reticle AF system 28 shown in FIG. 1, is fluctuated by dZ. This operation is performed, for example, when the control information is supplied from the main control system 31 to the blind control system 33 to drive the Z positions of the end portions of the blades 39 by dZ. Accordingly, the state (defocus amount) of the edge portion of the exposure area 27W on the wafer W is uniformly maintained, and it is possible to perform the exposure highly accurately.

However, when the Z position of the end portion of the blade 39 is changed by dZ assuming that L represents the distance from the center of the rotary shaft 37a of the rotatable member 37 to the end portion of the blade 39, the position in the Y direction of the end portion of the blade 39 is changed approximately by dY represented by the following expression.

$$dY = (L^2 + dZ^2)^{1/2} - L \quad (1)$$

In view of the above, in a case that the Z positions of the end portions of the blades 39 are changed by dZ (approximately dZ/L (rad) as converted into the angle of inclination), the blind control system 33 moves the positions in the Y direction of the respective blades 39 by dY as defined in the expression (1) via the blind units 38, in order that the position in the Y direction of the end portions of the blades 39 are maintained to be in the state having been previously provided. With this also, even in a case that the blades 39 are inclined with respect to the postures before the movement (or with respect to the optical axis of the illumination light), it is possible to maintain the constant slit width of the illumination area 27R.

The plurality of blind units 38 of the variable blind 35 shown in FIG. 3A have a common structure or arrangement, except for the shape of the blade 39. Therefore, the structure or arrangement of one blind unit 38 will be representatively explained.

Figure 4:
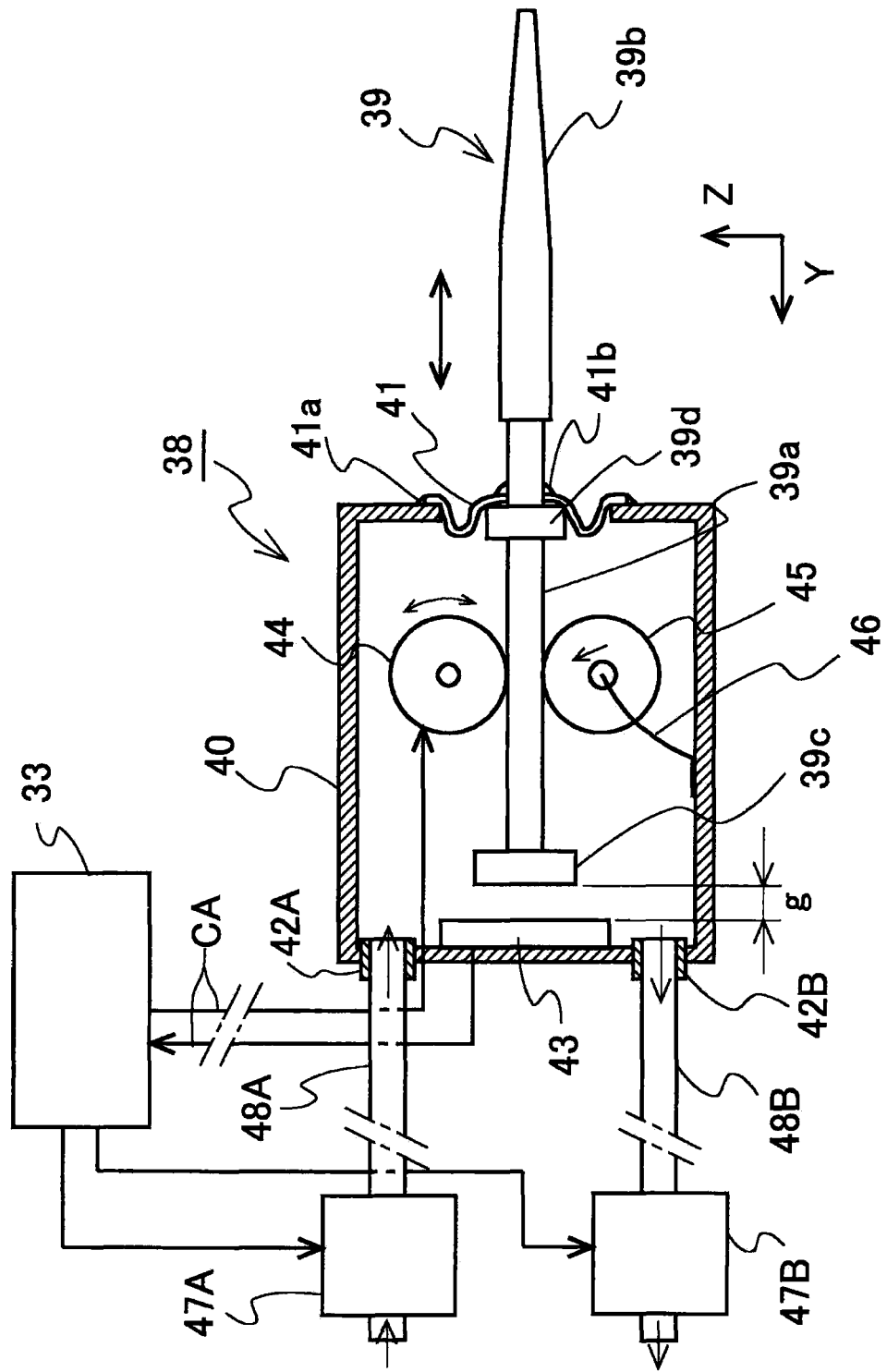
FIG. 4 is a sectional view of the construction of the blind unit 38 shown in FIG. 3A.

FIG. 4 is a magnified sectional view of the construction of the blind unit 38 shown in FIG. 3A. With reference to FIG. 4, the blind unit 38 includes a box-shaped member 40 having high pressure resistance; a diaphragm 41 which is attached to the front surface of the box-shaped member 40 and which is flexible to some extent in the Y direction (within a range including the movement stroke of the blade 39 in the Y direction); the blade 39 which is fixed to a central portion of the diaphragm 41; a capacitive sensor 43 which is arranged in the box-shaped member 40 (in the internal space of the box-shaped member 40) and which detects a gap g in the Y direction with respect to an end portion (one end) 39c of the blade 39; and a rotary motor 44 which is fixed in the box-shaped member 40 and which displaces the blade 39 in the Y direction. Each of the box-shaped member 40 and the diaphragm 41 is made of metal including, for example, stainless steel in which the degassing is scarcely caused. Further, a guide roller 45 which urges the blade 39 toward the rotary motor 44 and a plate spring 46 for preloading are provided in the box-shaped member 40, and the blade 39 is held by the frictional force.

The capacitive sensor 43 and the rotary motor 44 are connected to the blind control system 33 via the signal cables CA. The blind control system 33 determines the position in the Y direction of the end portion (the other end) of the blade 39 from the gap g detected by the capacitive sensor 43, and the blind control system 33 controls the position in the Y direction of the blade 39 via the rotary motor 44 so that the position in the Y direction has the value set by the main control system 31.

The blade 39 includes a rod-shaped shaft portion 39a which is driven by the rotary motor 44; the end portion 39c which is fixed to an end portion in the +Y direction of the shaft portion 39a; a step portion 39d which is provided to stably transmit the urging force in the +Y direction from the diaphragm 41 to the shaft portion 39a; and a flat plate portion 39b which is fixed to the tip or end of the shaft portion 39a. The step portion 39d is formed to protrude in the circumferential direction of the shaft portion 39a between the end portion 39c and the tip. The EUV light is directly irradiated onto the flat plate portion 39b which functions as the light shielding member. Therefore, the flat plate portion 39b is formed of a highly heat resistant ceramics such as zirconia or a highly heat resistant metal such as beryllium (Be) or chromium-molybdenum steel. Each of the shaft portion 39a and the step portion 39d of the blade 39 is made of metal having a high coefficient of thermal conductivity. The end portion 39c may be, for example, an electrode of the capacitive sensor 43.

The boundary between the box-shaped member 40 and the diaphragm 41 is sealed by a weld portion 41a, and the boundary between the diaphragm 41 and the blade 39 is sealed by a weld portion 41b. The interior of the box-shaped member 40 is in a gas-tight state. In this embodiment, the exterior of the box-shaped member 40 is in high vacuum in order to allow the EUV light to pass therethrough. The interior of the box-shaped member 40 is approximately at the atmospheric pressure. A gas supply port 42A and a gas discharge port 42B are provided through the bottom surface of the box-shaped member 40. A gas feed section 47A which feeds the gas (refrigerant or cooling medium) such as a cooled air or the like and a sucking section 47B which sucks (recovers) the gas are arranged at the outside of the vacuum chamber 1 shown in FIG. 1. The cooled gas fed from the gas feed section 47A is supplied into the box-shaped member 40 via a piping 48A and the gas supply port 42A. The gas flowing through the box-shaped member 40 is recovered by the sucking section 47B via the gas discharge port 42B and a piping 48B. The gas feed section 47A and the sucking section 47B are controlled by the blind control system 33.

According to this blind unit 38, the driving force of the rotary motor 44 is transmitted to the shaft portion 39a, to thereby move the flat plate portion 39b. That is, the blade 39 performs the rectilinear motion in the Y direction by the rotary motor 44 and the guide roller 45. Therefore, the position in the Y direction of the blade 39 can be stably controlled highly accurately by the rotary motor 44. Further, the rotary motor 44 scarcely generates the minute foreign matters such as the dust or the like during the driving operation. Even if the foreign matters are generated in the box-shaped member 40, such foreign matters are recovered via the sucking section 47B.

The function and the effect of this embodiment are as follows.

(1) The blind unit 38 shown in FIG. 4 of this embodiment is a unit for adjusting the light amount of the exposure light, and includes the blade 39 which shields the part of the exposure light; the blind control system 33 and the rotary motor 44 which drive the blade 39 in the Y direction in order to control the light amount of the exposure light on the wafer; the capacitive sensor 43 which detects the displacement in the Y direction of the blade 39; the box-shaped member 40 which accommodates the capacitive sensor 43 and the rotary motor 44; and the diaphragm 41 which provides the gas-tight sealing between the flat plate portion 39b of the blade 39 and the box-shaped member 40 (which gas-seals the box-shaped member 40 with respect to the flat plate portion 39b of the blade 39).

Therefore, since the box-shaped member 40 is gas-sealed, even if the minute foreign matters such as the dust or the like are generated from the rotary motor 44, the foreign matters do not go out of the box-shaped member 40, and the foreign matters do not adhere to the reticle surface and the optical members constructing the illumination optical system ILS and the projection optical system PO shown in FIG. 1. In other words, the space, in which the rotary motor 44 for driving the blade 39 is accommodated, is separated from the space in which the reticle surface, the illumination optical system ILS, and the projection optical system PL are accommodated. Therefore, even if the minute foreign matters such as the dust or the like are generated from the rotary motor 44, the foreign matters do not enter into the space in which the reticle surface, the illumination optical system ILS, and the projection optical system PL are accommodated. Therefore, any unnecessary pattern is not transferred onto the wafer W. Further, the reflectance of the optical member is maintained to be high. Therefore, the throughput of the exposure step is maintained to be high.

The heat generated from the rotary motor 44 is shielded by the box-shaped member 40, and the heat is not directly radiated to the reticle surface and the other optical members. Therefore, the influence of the heat is mitigated. That is, the heat transfer is suppressed between the space in which the rotary motor 44 is accommodated and the other spaces.

(2) The diaphragm 41 is flexible, and hence the diaphragm 41 enables the blade 39 to be moved (displaced) relative to the box-shaped member 40 (or the illumination light) while maintaining the gas-tightness of the box-shaped member 40. In the blind unit 38 shown in FIG. 4, the diaphragm 41 has the function to restore the position of the blade 39, for example, to the position in the initial state (neutral position). Therefore, it is unnecessary to additionally provide, for example, any spring mechanism for urging the blade 39. Further, the blade 39 is guided in the Y direction by the rotary motor 44 and the guide roller 45. Therefore, the position in the Y direction of the blade 39 can be set or determined highly accurately.

(3) The box-shaped member 40 is provided with the gas supply port 42A, and the cooling gas is supplied from the external gas feed section 47A via the piping 48A and the gas supply port 42A to the interior of the box-shaped member 40. Therefore, the heat generated from the rotary motor 44 and the radiation heat applied from the exposure light to the blade 39 are discharged by the cooling gas. Therefore, the radiation heat from the box-shaped member 40 is further reduced.

(4) The variable blind 35 shown in FIG. 3A has the plurality of blind units 38, and the blades 39 of the blind units 38 are arranged on the same plane. Therefore, the blades 39 can be arranged on the field diaphragm plane, etc., in the vicinity of the reticle R of the exposure apparatus. By controlling the positions of the blades 39 in the Y direction, it is possible to highly accurately control the width of the slit-shaped illumination area 27R on the reticle R (consequently the exposure area 27W on the wafer W) as well as the light amount of the exposure light on the wafer W corresponding to the illumination area 27R.

(5) The variable blind 35 shown in FIG. 3A is provided with the plurality of blind units 38 each of which includes the blade 39; and the rotatable member 37 and the rotary motor 49 which are provided to control the angles of inclination of the plurality of blind units 38 in order to control the positions in the Z direction (positions in the optical axis direction of the exposure light) of the tips or end portions of the blades 39 (tips or end portions of the flat plate portions 39b).

Therefore, for example, it is possible to easily and integrally adjust the Z positions of the tips or end portions of the blades 39 of the plurality of blind units 38, based on the change of the Z position of the reticle surface.

(6) When the position in the Y direction of the blade 39 is changed as expressed by the expression (1) depending on the angle of inclination of the blind unit 38 (angle of rotation of the rotary motor 44), the position in the Y direction of the blade 39 is adjusted by the rotary motor 44 so that the change is offset. Therefore, even when the angle of inclination of the blind unit 38 is changed, it is possible to maintain the constant width in the Y direction of the illumination area 27R.

(7) The exposure apparatus 100 shown in FIG. 1 is the exposure apparatus in which the pattern of the reticle R is illuminated with the exposure light EL, and the wafer W is exposed with the exposure light EL via the pattern and the projection optical system PO, wherein the part of the exposure light EL is shielded by the blades 39 of the plurality of blind units 38 of the variable blind 35. Therefore, by controlling the positions of the blades 39 to control the shielding amount, it is possible to easily define a desired shape for the shape of the illumination area on the reticle R as well as the shape of the exposure area on the wafer W, thereby making it possible to highly accurately control the totalized exposure amount at each of the points on the wafer W after the scanning exposure. In this procedure, the influence is mitigated in relation to the dust generation and the heat generation of the rotary motor 44 of each of the blind units 38. Therefore, the wafer W can be exposed with the pattern of the reticle R highly accurately at the high throughput.

(8) In this case, for example, the illuminance distribution in the X direction of the exposure area 27W is previously measured by the radiation amount monitor 29 disposed on the wafer stage WST, and the position of the blade 39 of each of the blind units 38 is controlled by the blind control system 33 based on the measurement result, for example, so that the illuminance distribution is uniform. With this, the uniformity is improved for the totalized exposure amount on the wafer W.

Next, an explanation will be made with reference to FIGS. 5 to 7 about modifications of the blind unit 38 shown in FIG. 4. The parts or components, which correspond to those shown in FIG. 4, are designated by the same reference numerals in FIGS. 5 to 7, any detailed explanation of which will be omitted.

Figure 5:
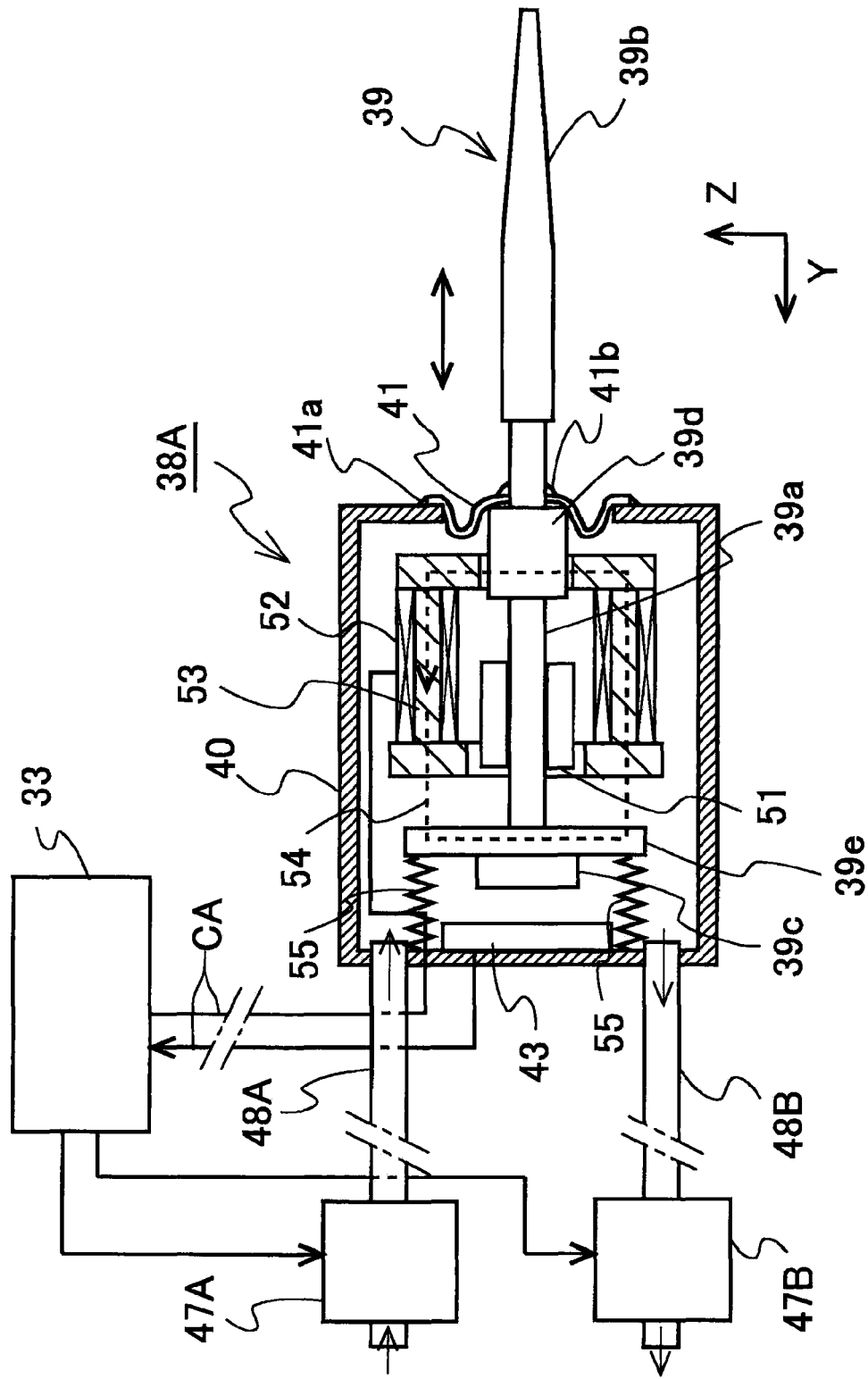
FIG. 5 is a sectional view of the construction of a blind unit 38A of a first modification.

FIG. 5 shows, with partial cutaway, a blind unit 38A of a first modification. With reference to FIG. 5, a shaft portion 39a of a blade 39 is guided in the Y direction by a bearing 51 in a box-shaped member 40. A step portion 39d is formed of a magnetic member and the step portion 39d is made to be thick. A core member 39e (driving force-transmitting unit) formed of a magnetic member is fixed to a lower end portion 39c of the blade 39. The core member 39e is urged toward the bottom surface side of the box-shaped member 40 by tensile coil springs 55. Further, a core member 53 is arranged in the box-shaped member 40 so as to surround the shaft portion 39a; a coil 52 is wound around the core member 53; and the driving current is supplied to the coil 52 from the blind control system 33. The other parts or components are constructed in the same manner as those of the embodiment shown in FIG. 4.

In the first modification, a closed magnetic circuit 54 is formed in the core members 39e, 53 by supplying the current to the coil 52 in the same manner as in the EI core system. By controlling the current, it is possible to control the attracting force of the core member 39e (as well as the blade 39) with respect to the side of the core member 53 (in the −Y direction). Accordingly, it is possible to move the blade 39 in the Y direction. In this construction, the blade 39 can be driven (moved) in the Y direction by applying the driving force from the core member 53 to the blade 39 in a non-contact manner. Therefore, the generation of the dust is further reduced in the driving unit.

Figure 6A:
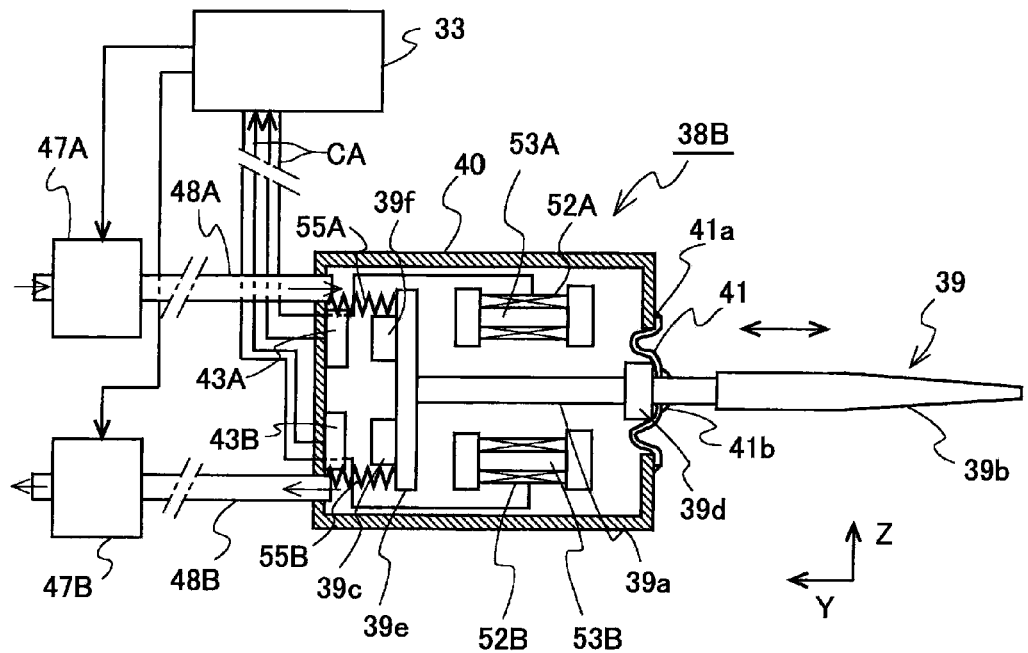
FIG. 6A is a sectional view of the construction of a blind unit 38B of a second modification.
Figure 6B:
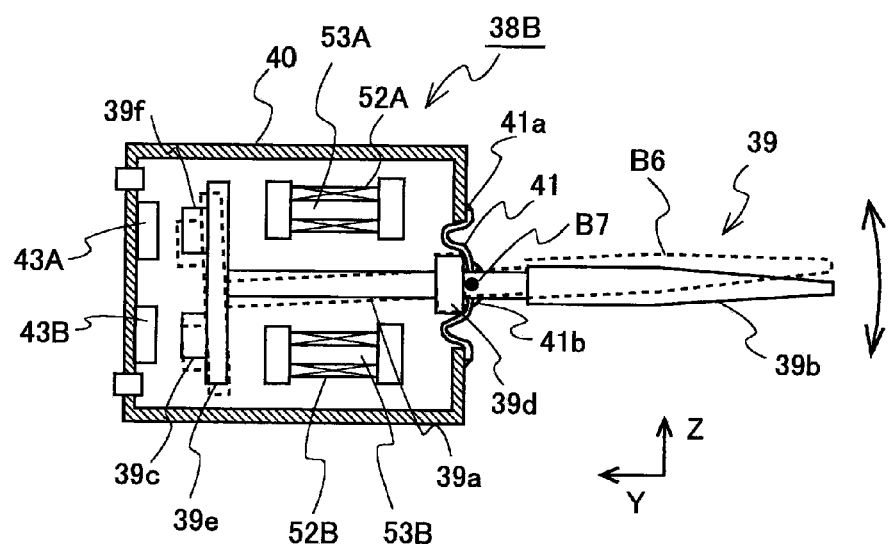
FIG. 6B shows main components of the blind unit 38B in a state that a blade 39 shown in FIG. 6A is rotated.

FIG. 6A shows, with partial cutaway, a blind unit 38B of a second modification. With reference to FIG. 6A, a core member 39e (driving force-transmitting unit) formed of a magnetic member is fixed to an end of a shaft portion 39a of a blade 39 in a box-shaped member 40; first and second core members 53A, 53B are arranged to interpose the shaft portion 39a in the Z direction; coils 52A, 52B are wound around the core members 53A, 53B, respectively. Driving currents are individually supplied from the blind control system 33 to the coils 52A, 52B. Further, lower end portions 39f, 39c are fixed to the bottom surface of the core member 39e so that the lower end portions 39f, 39c are opposite to or face the core members 53A, 53B; and capacitive sensors 43A, 43B are fixed to the bottom surface of the box-shaped member 40 to individually measure the gaps with respect to the lower end portions 39f, 39c. Furthermore, the core member 39e is urged toward the bottom surface of the box-shaped member 40 by tensile coil springs 55A, 55B which are fixed to the bottom surface of the box-shaped member 40 so that the tensile coil springs 55A, 55B are opposite to the core members 53A, 53B. The other parts or components are constructed in the same manner as those of the embodiment shown in FIG. 4.

In the second modification, the attracting forces exerted between the core member 39e and the core members 53A, 53B can be independently controlled by controlling the currents supplied to the coils 52A, 52B. Therefore, by commonly controlling the two attracting forces, it is possible to control the position of the blade 39 in the Y direction. Further, by making the two attracting forces differ, it is possible to rotate the blade 39 about a support point B7 at the central portion of the diaphragm 41, as the rotation center, for example, as shown by a position B6 depicted by dotted lines in FIG. 6B. Accordingly, it is possible to control the Z position of the tip or end portion of the blade 39. Therefore, it is possible to omit the mechanism for rotating the plurality of blind units 38 as a whole as shown in FIG. 3A. The Z position of the tip or end portion of the blade 39 can be individually controlled as well.

However, when the position of the tip or end portion of the blade 39 in the Y direction is changed by rotating the blade 39, it is also allowable to adjust the position of the blade 39 in the Y direction so that the change of the position may be offset.

Figure 7:
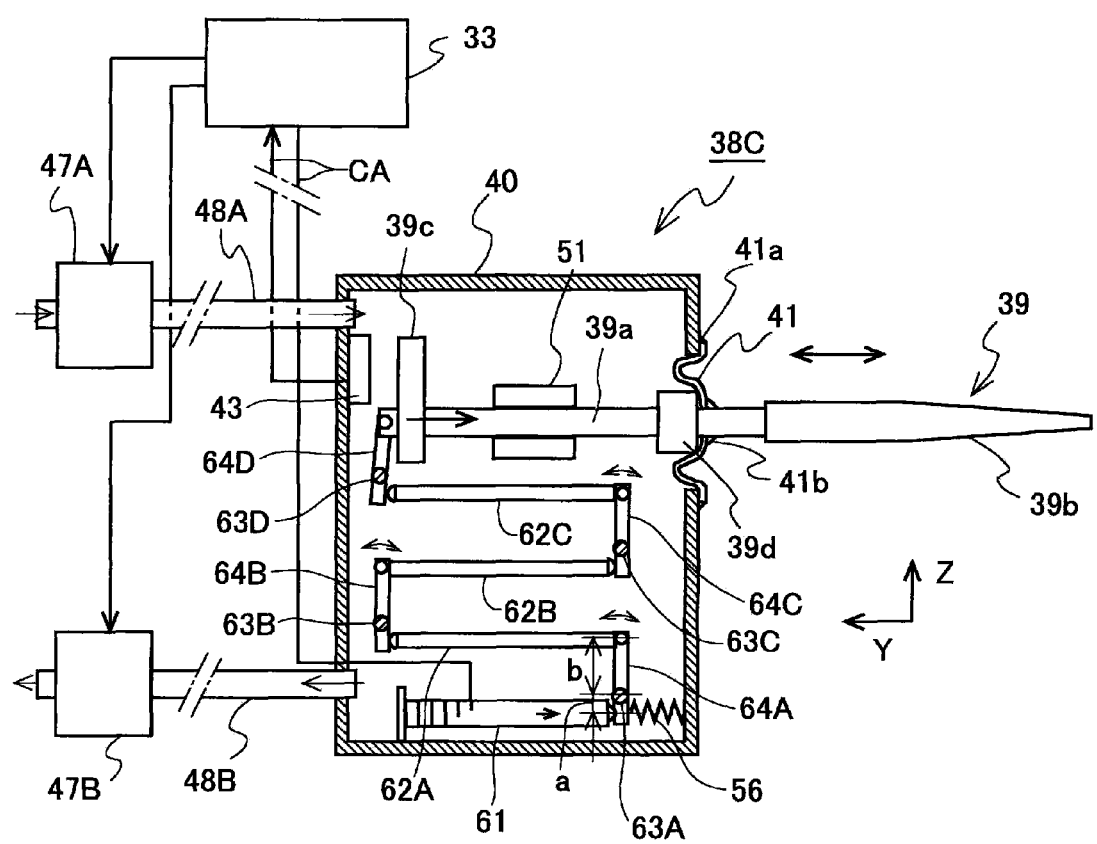
FIG. 7 is a sectional view of the construction of a blind unit 38C of a third modification.

FIG. 7 shows, with partial cutaway, a blind unit 38C of a third modification. With reference to FIG. 7, a shaft portion 39a of a blade 39 is guided in the Y direction by a bearing 51 in a box-shaped member 40. A driving element 61, which is formed of a stacked piezoelectric element (piezo-element) and which is expandable/contractible in the Y direction, is fixed to the side surface of the box-shaped member 40 opposite to or facing the shaft portion 39a. Rods 62A, 62B, 62C, which are long in the Y direction, are arranged between the driving element 61 and the shaft portion 39a. The tip or end portion of the driving element 61 and one end of the rod 62A, the other end of the rod 62A and one end of the rod 62B, the other end of the rod 62B and one end of the rod 62C, and the other end of the rod 62C and the end of the shaft portion 39a are connected to one another by link members 64A, 64B, 64C, 64D which are rotatable about pivots 63A, 63B, 63C, 63D respectively. The ends of the link members 64A to 64D are urged toward the driving element 61 or the rods 62A to 62C by, for example, compressive coil springs 56 (the compressive coil springs 56 are shown at only one position in the drawing) respectively. The link members 64A to 64D, the rods 62A to 62C, and the pivots 63A to 63D constitute the link mechanism (or the driving force-transmitting unit).

A capacitive sensor 43 is fixed at a position opposite to or facing the lower end portion 39c of the blade 39. The blind control system 33 controls the expansion/contraction amount of the driving element 61 based on the position in the Y direction of the blade 39 determined from the detection result obtained by the capacitive sensor 43. The other parts or components are constructed in the same manner as those of the embodiment shown in FIG. 4.

In the third modification, it is assumed that "a" represents the spacing distance between the driving element 61 and pivot 63A, and "b" represents the spacing distance between the pivot 63A and the rod 62A. On this assumption, when the spacing distances "a" and "b" are set, for example, as follows, the expansion/contraction amount of the driving element 61 is magnified or expanded four times by the rod 62A.

$$a:b=1:4 \quad (2)$$

It is assumed that the displacement is also magnified or expanded by each of the other link members 64B to 64D four times. On this assumption, expansion/contraction amount by of the driving element 61 in the Y direction is magnified approximately 256 times as follows to provide amount of movement ΔY of the blade 39 in the Y direction.

$$\Delta Y = 4 \times 4 \times 4 \times 4 \times \delta y = 256 \cdot \delta y \quad (3)$$

Therefore, for example, assuming that the driving amount δy of the driving element 61 is 4 μm, the blade 39 can be driven in the Y direction by a stroke of 1024 μm, i.e., about 1 mm. The number of the stages and the magnifications (b/a) of the link members 64A to 64D can be arbitrarily set depending on the necessary amount of movement ΔY and the driving amount δy of the driving element 61.

According to the third modification, the driving amount of the driving element 61 is magnified or expanded by the link mechanism. Therefore, it is possible to decrease the driving amount of the driving element 61 itself, and it is possible to reduce the amount of heat generation.

In the embodiments described above, the capacitive sensor 43 is used in order to detect the displacement of the blade 39. However, in order to detect the displacement, it is also possible to use other sensors including, for example, proximity sensors of the optical system, small-sized linear encoders, and rotary encoders incorporated into the rotary motor, etc.

In the embodiments described above, the variable blind 35 shown in FIG. 1 is arranged in the vicinity of the reticle surface. However, the blind plate 26 and/or the large number of blind units 38 may be arranged in the vicinity of a conjugate plane conjugate with the reticle surface in the illumination optical system ILS.

In the embodiments described above, the cooled gas is supplied into the box-shaped members 40 of the blind units 38. However, instead of this, for example, a cooled liquid (refrigerant) may be made to flow through a piping which makes tight contact with a side surface of the box-shaped member 40. Further, a Peltier element (endothermic element) may be fixed to the side surface of the box-shaped member 40, and the heat generation of the Peltier element may be discharged with the refrigerant.

In the embodiments described above, the construction has been explained, in which the angle of rotation of the blind unit 38 or the Z position of the end portion of the blade 39 is controlled based on the measured value obtained by the reticle AF system 28. However, the present invention is not limited to this construction. For example, the position of the reticle surface in the Z direction, which is changed when the reticle R is moved in the Y direction, is previously measured, and an obtained result is stored as the map information. The angle of rotation of the blind unit 38 or the Z position of the end portion of the blade 39 may be controlled based on the stored map information. When the construction as described above is adopted, it is possible to omit the reticle AF system.

In the embodiments described above, the interior of the box-shaped member 40 is at the atmospheric pressure. However, the interior of the box-shaped member 40 may be vacuum evacuated. For example, the gas pressure of the box-shaped member 40 may be the same as the gas pressure in the vacuum chamber 1. In this case, as described above, the Peltier element may be fixed to the side surface of the box-shaped member 40, and the temperature of the box-shaped member 40 may be adjusted.

In the embodiments described above, the variable blind 35 is arranged in the vicinity of the pattern surface of the reticle R. However, the variable blind 35 may be arranged between the projection optical system PO and the wafer W.

In the embodiments described above, the laser plasma light source is used as the exposure light source. However, there is no limitation to this. It is also allowable to use any one of, for example, the SOR (Synchrotron Orbital Radiation) ring, the betatron light source, the discharged light source, the X-ray laser, etc.

In the embodiments described above, the EUV light source is used as the exposure light. However, the present invention is also applicable to any exposure apparatus which uses, as the exposure light, for example, the excimer laser beam such as KrF (wavelength: 248 nm) or ArF (wavelength: 193 nm) or the high harmonic wave of the solid-state laser. When the exposure light, which is transmitted even through the gas, is used, the illumination optical system and the projection optical system may be dioptric or catadioptric systems. In this case, the reticle may be of the transmission type as well, and the variable blind 35 may be installed, for example, in the arrangement shown in FIG. 2B. Accordingly, the illumination area may be defined on the reticle by using the system of the transmission type.

In a case that the gas is present in the optical path for the exposure light, for example, a diaphragm or a bellows, which is made of, for example, a thin metal or synthetic resin and which is more flexible, may be used in place of the diaphragm 41, because the differential pressure is small between the interior and the exterior of the diaphragm 41 of the box-shaped member 40 shown in FIG. 4. Alternatively, it is also allowable to use an elastic film or a cylindrical bellows, etc. in which a part or portion thereof protrudes from the box-shaped member 40. In this specification, such elastic film and cylindrical bellows, etc. are collectively referred to as "bellows mechanism" as well.

In the embodiments described above, the internal gas in the box-shaped member 40 is supplied to and discharged from the box-shaped member 40 by the gas feed section 47A and the sucking section 47B via the gas supply port 42A and the gas discharge port 42B. However, the gas supply port 42A, the gas discharge port 42B, the gas feed section 47A, and the sucking section 47B may be omitted by closing or sealing the box-shaped member 40 hermetically or tightly.

In the embodiments described above, the light shielding unit provided for the exposure apparatus and the variable slit apparatus provided with the same have been explained as exemplified by the blind unit 38 and the variable blind 35 by way of example. However, the light shielding member and the variable slit apparatus provided with the same of the present invention are not limited to the case of the use for the exposure apparatus, and are also effective, for example, for photographing apparatuses and measuring instruments to be used in the space in the cosmos.

In the embodiments described above, the variable blind 35, in which the blind units 38 are arranged on the same plane, has been explained. However, the blind unit 38 may used singly or a pair of the blind units 38 may be used depending on the way of use.

Figure 8:
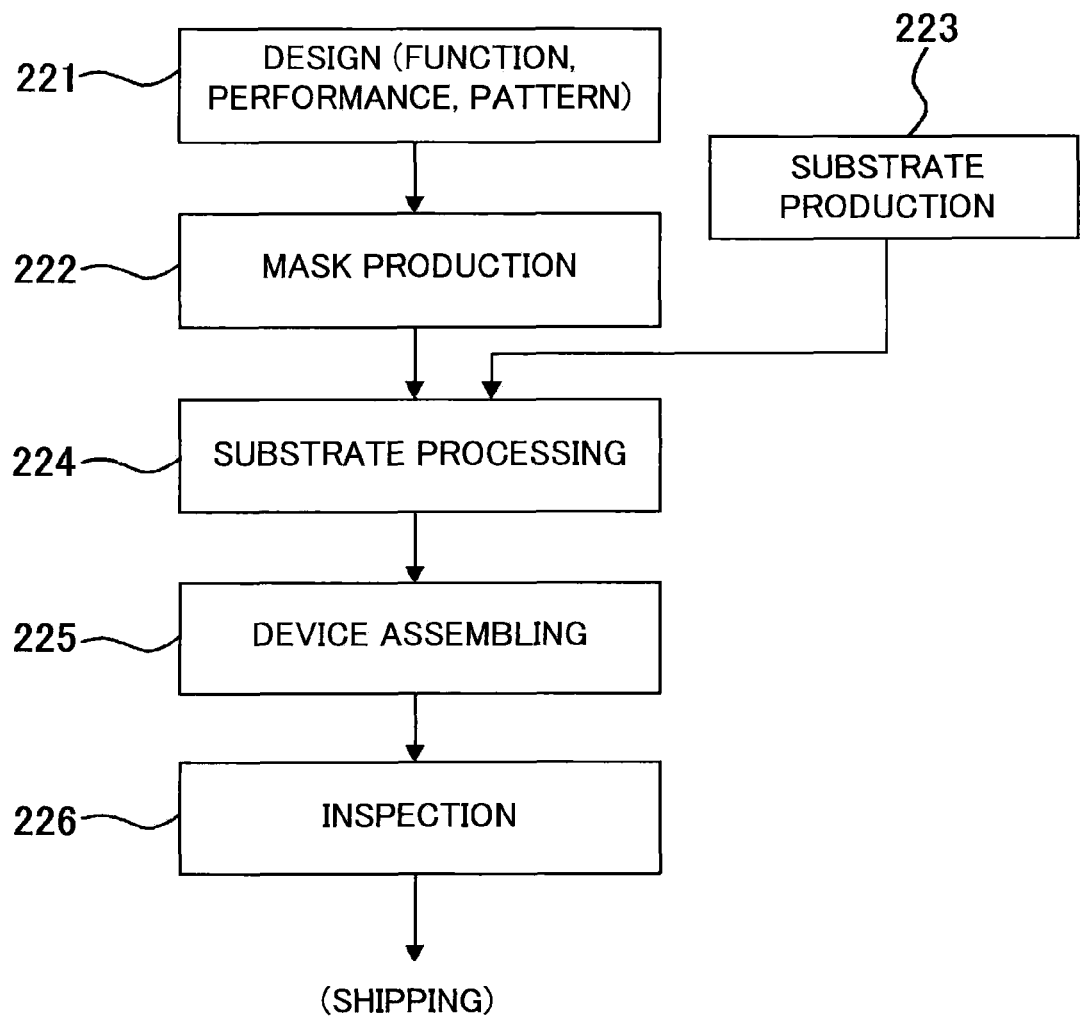
FIG. 8 is a flow chart illustrating an example of steps for producing a device.

When an electronic device such as a semiconductor device (or a microdevice) is produced by using the exposure apparatus of the embodiment described above, the electronic device is produced by performing, for example, as shown in FIG. 8, a step 221 of designing the function and the performance of the electronic device; a step 222 of manufacturing a mask (reticle) based on the designing step; a step 223 of producing a substrate (wafer) as a base material for the device and coating the substrate (wafer) with the resist; a substrate-processing step 224 including, for example, a step of exposing the substrate (photosensitive substrate) with the pattern of the mask by the exposure apparatus (EUV exposure apparatus) of the embodiment described above, a step of developing the exposed substrate, and a step of heating (curing) and etching the developed substrate; a step 225 of assembling the device (including processing processes such as a dicing step, a bonding step, and a packaging step); an inspection step 226; and the like. In the exposure step, the substrate is subjected to the scanning exposure by synchronously moving the reticle R and the wafer W in the Y direction with respect to the projection optical system PO (exposure light) while forming the elongated circular arc-shaped exposure illumination area extending in the X direction on the reticle surface by illuminating the reticle by the illumination optical system ILS. Since the exposure method using the exposure apparatus is known to those skilled in the art, any detailed explanation of the exposure method is omitted.

In other words, the method for producing the device includes exposing the substrate (wafer) arranged or disposed on the projection surface by using the exposure apparatus of the embodiment described above, and processing the exposed substrate (Step 224). In this procedure, according to the exposure apparatus of the embodiment described above, the influence, which would be otherwise exerted by the dust generation and the heat generation in relation to the variable blind 35, is mitigated. Therefore, the device can be produced highly accurately at the high throughput. Further, it is possible to reduce the maintenance cost for the exposure apparatus.

According to the light shielding unit, the variable slit apparatus, and the exposure apparatus provided with the same of the present invention, it is possible to suppress the dust generation and the heat generation which would be otherwise caused, for example, by the driving device for the light shielding member. Therefore, it is possible to avoid the thermal deformation and the pollution of surrounding optical elements. Therefore, by using the present invention, it is possible to produce a high performance device at the high throughput. Therefore, the present invention will remarkably contribute to the international development of the precision mechanical equipment industry including the semiconductor industry.

What is claimed is:

1. A variable slit apparatus which forms an illumination light having a predetermined shape, the variable slit apparatus comprising:
    a plurality of light shielding units, each of the light shielding units including:
        a light shielding member which shields a part of an illumination light;
        a driving mechanism which drives the light shielding member linearly to control a light amount of the illumination light;
        a detector which detects a driving amount of the light shielding member;
        a case which accommodates the driving mechanism and the detector; and
        a bellows mechanism which gas-seals the case with respect to the light shielding member,
    wherein the plurality of light shielding units are arranged in a direction and the light shielding members of the light shielding units are arranged in the direction so as to form a gap in the direction between any two adjacent light shielding members.

2. The variable slit apparatus according to claim 1, wherein the bellows mechanism has a diaphragm which restores a position of the light shielding member.

3. The variable slit apparatus according to claim 1, wherein the driving mechanism has a rotary motor, and a converting unit which converts a driving amount of the rotary motor into a driving amount of the light shielding member.

4. The variable slit apparatus according to claim 1, wherein the driving mechanism has a magnetic member which is provided on the light shielding member, and an electromagnetic core which drives the magnetic member.

5. The variable slit apparatus according to claim 4, wherein the magnetic member has first and second magnetic members; and
    the electromagnetic core has first and second electromagnetic cores which drive the first and second magnetic members independently from each other.

6. The variable slit apparatus according to claim 1, wherein the driving mechanism has a driving element, and a displacement-expanding unit which expands displacement of the driving element to drive the light shielding member.

7. The variable slit apparatus according to claim 1, further comprising a supply port which supplies a cooling gas into the case.

8. The variable slit apparatus according to claim 1, further comprising a tilt mechanism which controls an angle of inclination of the light shielding member to control a position, of the light shielding member, in an optical axis direction of the illumination light.

9. The variable slit apparatus according to claim 1, further comprising a transmitting unit which is connected to the light shielding member and which transmits a driving force from the driving mechanism to the light shielding member, wherein the transmitting unit is accommodated in the case.

10. The variable slit apparatus according to claim 1, wherein the light shielding members of the light shielding units are arranged in a same plane.

11. The variable slit apparatus according to claim 10, wherein the light shielding members of the light shielding units have mutually different shapes depending on the predetermined shape.

12. An exposure apparatus which illuminates a pattern with an exposure light and exposes a substrate with the exposure light via the pattern and a projection optical system, the exposure apparatus comprising the variable slit apparatus as defined in claim 10;
    wherein a part of the exposure light is shielded by the light shielding members of the variable slit apparatus.

13. The exposure apparatus according to claim 12, further comprising:
    a measuring device which measures light amount information about the exposure light passing through the projection optical system; and
    an adjusting device which adjusts a light amount of the exposure light by driving the light shielding members of the variable slit apparatus depending on a measurement result obtained by the measuring device.

14. A method for producing a device, comprising:
    exposing a photosensitive substrate by using the exposure apparatus as defined in claim 12; and
    processing the exposed photosensitive substrate.

15. A variable slit apparatus which forms an illumination light having a predetermined shape, the variable slit apparatus comprising:
    a plurality of light shielding units which include light shielding members shielding a part of the illumination light, respectively, wherein each light shielding unit includes a driving mechanism which drives its respective light shielding member linearly to control a light shielding amount of the illumination light; and
    a tilt mechanism which controls angles of inclination of the plurality of light shielding units or the light shielding members of the light shielding units to control positions of the light shielding members in an optical axis direction of the illumination light.

16. The variable slit apparatus according to claim 15, further comprising an adjusting unit which adjusts the light shielding amount by controlling the light shielding members of the light shielding units to adjust the angles of inclination of the light shielding units or the light shielding members.

17. The variable slit apparatus according to claim 15, further comprising a base member which supports the plurality of light shielding units in parallel;

wherein the tilt mechanism has a mechanism which rotates the base member about an axis substantially parallel to a direction of arrangement of the plurality of light shielding units.

18. The variable slit apparatus according to claim 15, wherein each of the light shielding units includes:
- a detector which detects a driving amount of the light shielding member;
- a case which accommodates the driving mechanism and the detector; and
- a bellows mechanism which gas-seals the case with respect to the light shielding member.

19. The variable slit apparatus according to claim 18, wherein the bellows mechanism has a diaphragm which restores a position of the light shielding member.

20. An exposure apparatus which exposes a substrate with an illumination light via a pattern, the exposure apparatus comprising:
- a variable slit having a plurality of light shielding members which are arranged on a same plane and in a direction and which shield a part of the illumination light, and a driving device which drives the light shielding members linearly to control a light amount of the illumination light; and
- an optical system which guides the illumination light, passing through the variable slit, to the substrate;
- wherein the driving device exists in a space which is independent from a space in which the light shielding members exist and a space in which the optical system exists; and
- wherein the light shielding members are arranged so as to form a gap in the direction between any two adjacent light shielding members.

21. The exposure apparatus according to claim 20, further comprising a transmitting unit which transmits a driving force from the driving device to the light shielding members, wherein the transmitting unit exists in the space in which the driving device exists.

22. The exposure apparatus according to claim 20, wherein the transmitting unit receives the driving force from the driving device in a non-contact manner.

23. The exposure apparatus according to claim 20, wherein a space, in which the pattern exists, is independent from the space in which the driving device exists.

* * * * *